United States Patent [19]
Mehregany

[11] Patent Number: 5,093,594
[45] Date of Patent: Mar. 3, 1992

[54] MICROFABRICATED HARMONIC SIDE-DRIVE MOTORS

[75] Inventor: Mehran Mehregany, Shaker Heights, Ohio

[73] Assignee: Massachusetts Institute of Technology, Cambridge, Mass.

[21] Appl. No.: 542,202

[22] Filed: Jun. 22, 1990

[51] Int. Cl.$^5$ ............................................... H02N 1/00
[52] U.S. Cl. ............................ 310/82; 310/40 MM; 310/309
[58] Field of Search ............. 310/40 MM, 82, 83, 309; 318/116

[56] References Cited

U.S. PATENT DOCUMENTS 4,754,185  6/1988  Gabriel et al. ...................... 310/309

FOREIGN PATENT DOCUMENTS 867883  7/1949  Fed. Rep. of Germany ........ 310/82
697371  9/1953  United Kingdom .................. 310/82

OTHER PUBLICATIONS

Ganon, "Magic Micromachine", *Popular Science*, Mar. '89, pp. 88-93.
Laithwaite, "Linear-Motion Electrical Machines", *Proc. IEEE*, v. 58, No. 4, Apr. '70, pp. 531-542.
Mehregany et al., "Study of Three Microfabricated Variable-Capacitance Motors", *Proc. 4th Int. Conf. on Solid State Sensors and Actuators*, Montreux, Switzerland, Jun. 25, '89.

Primary Examiner—Steven L. Stephan
Assistant Examiner—D. L. Rebsch
Attorney, Agent, or Firm—Wolf, Greenfield & Sacks

[57] ABSTRACT

A microfabricated, harmonic side-drive "wobble" type micromotor exhibiting increased torque output without the need for air levitation or for insulation on the rotor. Stator pieces are arranged about a circular space. In the center of that space is a bearing. An annular rotor in the space, about the bearing, has an inner surface always in rolling contact with the bearing. The outer surface of the rotor is separated from the stator by an air gap.

5 Claims, 2 Drawing Sheets

MICROFABRICATED HARMONIC SIDE-DRIVE MOTORS

RELATED APPLICATION

The subject matter of this application is related to that of the following commonly assigned application filed on even date herewith, the disclosure of which is hereby incorporated by reference: Howe et al, "Apparatus and Method for Side Drive Electrostatic Micromotor", Ser. No. 542,435, filed 22 June 1990, now U.S. Pat. No. 5,043,043.

FIELD OF THE INVENTION

This invention relates to polysilicon, rotary variable-capacitance (VC) side drive electric motors and, more particularly, to the microfabrication of a unique side-drive wobble motor.

BACKGROUND OF THE INVENTION

The principles of operation, design and fabrication of electric micromotors have been investigated by numerous parties in recent years. Good background information and further discussion of the invention is contained in various of the following references, which are hereby incorporated by reference in their entireties:

W. Trimmer and R. Jebens, "An Operational Harmonic Electrostatic Motor", *Proc. of Micro Electro Mechanical Systems*, IEEE Robotics and Automation Council, Salt Lake City, Utah, Feb. 20 -22, 1989, at 1-16;

M. Mehregany et al, "Microfabricated Harmonic and Conventional Side-Drive Motors," Department of Electrical Engineering and Computer Science, Massachusetts Institute of Technology, Cambridge, Mass., Feb. 1990.

M. Mehregany et al, "A Study of Three Microfabricated Variable-Capacitance Motors," *Proc. 4th Int. Conf. on Solid State Sensors and Actuators (Transducers '89)*, Montreux, Switzerland, June 25-30, 1989;

S. C. Jacobsen et al, "The Wobble Motor: An Electrostatic, Planetary Armature, Microactuator," *Proc. of Micro Electro-Mechanical Systems*, IEEE Robotics and Automation Council, Salt Lake City, Utah, Feb. 20-22, 1989, at 17-24

M. Mehregany et al, "Principles in Design and Microfabrication of Variable Capacitance Side-Drive Motors," *36th National Symposium of the American Vacuum Society*, Boston, Mass., Oct. 23-24, 1989, at 108.

Mehregany et al., "Friction and Wear in Microfabricated Harmonic Side-Drive Motors," presented at IEEE Solid State Sensor & Actuator Workshop, Hilton Head, S.C., June 4-7, 1990.

Mehregany et al., "Operation of Microfabricated Harmonic and Ordinary Side-Drive Motors," presented at 3rd IEEE Workshop on Micro Electro Mechanical Systems, Napa Valley, Calif., February 1990.

Broadly speaking, it is the goal of workers in this field to produce machines or systems composed of large numbers of extremely small subsystems, each comprising one or more micromotors. One article describes such micro electro mechanical systems (MEMS) as machines constructed of small moving sub elements which have characteristic dimensions in the range of about 0.5 to 500 microns. The motivation for the development of such devices is the possibility of extending the advantages of small scale, which are currently available in electronic devices, to include mechanical systems with moving parts. Actuation systems composed of numerous, small elements could benefit from the ability to achieve high local field strength in regions between very small force producing elements, from using geometrically complex structures to arrange, and parallel, the force producing elements, such that they closely interact across large interfacial areas, and by combining the outputs of these structures in appropriate parallel-series combinations in order to develop desired relationships between force, displacement and velocity.

In general, micromotors are conceived to be electrostatic devices which must meet a number of challenging design constraints. The generation of strong electrostatic forces from reasonable voltages requires that gaps (across which fields act) be extremely small, of submicron dimensions if possible. Friction becomes a crucial consideration for relative motion of surfaces across such gaps. Relative surface smoothness is a much worse problem for microscopic surfaces than for macroscopic surfaces. Friction therefore can be a substantial factor. A destabilizing tendency is also present in any electrostatic device, as conductive or dielectric elements tend to clamp to any electrically active element. In micromotors fabricated to date, it is the rotor which tends to become clamped to an underlying shield. This rotor clamping has been attributed to the existence of a electric field between the rotor and the shield, which field is caused by a lack of proper electrical contact between these respective parts. The electrical contact between the rotor and the shield during motor operation is intended to come from mechanical contact of the rotor with the shield or the bearing, all of which are heavily doped polysilicon components. To facilitate this contact, the bearing often is fabricated in electrical contact with the shield. The electrostatic clamping of the rotor is a significant problem with variable-capacitance side drive micromotors. To overcome the frictional forces associated with the clamping of the rotor to the electric shield beneath it, air levitation assistance has been employed. However, it is desired to avoid the need for air levitation.

One of the potentially useful motor designs for micro actuators is the wobble motor, which is already reported in the literature. See, for example the Jacobsen et al article. Wobble motors have desirable feature, such as a built-in gear reduction and good torque characteristics, but so far they have suffered from the aforementioned need for air levitation assistance.

With reference to FIG. 1, which shows the geometry of a conventional wobble motor 10 in cross-section, the motor comprises a stator assembly 12 and a rotor 14. The rotor 14 contacts the stator at a point 16, called the rolling point (RP). The rotor axis 18 moves in a circular path around and parallel to the stator axis 22, at the wobble frequency $\omega_w$. As the rotor moves, the rolling point also moves around the interior aperture in the stator. At steady state, the wobble frequency is equal to the frequency $\omega_s$ at which the stator segments $24_1$-$24_N$ are cycled. The rotor output frequency, $\omega_r$, is related to the wobble frequency by the relationship $\omega_r = \omega_w[1-(R_2/R_r)]$, where $R_r$ represents the outer radius of the rotor and $R_s$ represents the inner radius of the stator. The rotor output frequency can thus be much slower than the wobble. In other words, there is an inherent gear ratio between the electric signal frequency and the rotor frequency.

Note that insulation is required on the rotor, and/or stator in direct contact during motor operation. This complicates the manufacturing process.

Five different fabrication schemes for wobble motor design are discussed in S. C. Jacobsen et al. These five approaches are: (1) direct micro assembly (DMA); (2) electro-discharge machining (EDM); (3) cylindrical photographic etching methods (CPE); (4) coextrusion of metal and plastic (CMP) and (5) silicon chip stack of from one to many chips, with etched holes aligned to form the stator cavity (SCS). None of these fabrication schemes is particularly well suited to the efficient, low-cost mass manufacture of reliable micromotors. Although these motors do not have a clamping problem since they do not utilize a substrate or consequently a shield, they are not compatible with integrated circuits for fabrication or interface purposes.

It is therefore an object of the present invention to provide an improved design for a micromotor.

Another object of the invention is to provide an improved design for a microfabricated wobble motor.

Yet a further object is to provide a micromotor formed of a suitable, semiconductor material.

Another object of the invention is to provide a micromotor which will operate for extended intervals without the need for air levitation.

Yet another object is to provide a wobble-type micromotor which does not require insulation on the rotor.

A further object of the invention is to provide a wobble micromotor which can be fabricated using integrated circuit manufacturing techniques.

SUMMARY OF THE INVENTION

The foregoing and other objects have been achieved with a microfabricated, harmonic side-drive "wobble" type micromotor exhibiting increased torque output and not requiring insulation on the rotor. Initial indications are that air levitation is not required, or at least that the motor can be operated substantial periods without air levitation.

In this motor, a plurality of stator pieces are arranged about a circular space. In the center of that space is a bearing. An annular rotor is disposed in the space, with the inner surface of the rotor annulus being always in rolling contact with the bearing. The outer surface of the rotor is separated from the stator by an air gap, avoiding the need for insulation.

A fabrication technique which involves improved release and testing procedures minimizes native oxide formation on the polysilicon structural parts.

The invention will be more fully understood from the detailed description presented below, which should be read in conjunction with the accompanying drawing.

DETAILED DESCRIPTION

Figure 2:
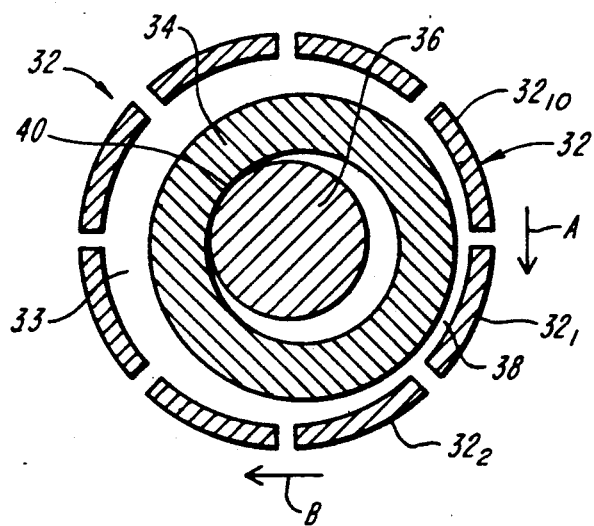
FIG. 2 is a diagrammatic representation of a cross-section of a wobble motor according to the present invention.

Turning to FIG. 2, there is shown a diagrammatic representation of a cross-section of a wobble motor according to the present invention. Like the prior art, this design includes a stator 32 having a plurality of stator pieces $32_1$–$32_{10}$, in a circular arrangement defining a central space 33. The rotor 34 is of a generally annular shape having a center bore, and is disposed in space 33 about a center bearing 36. Unlike the prior art, rotor 34 does not contact the stator but, rather, is separated therefrom by an air gap 38. The air gap 38 is maintained by the center bearing. The inner surface of rotor 34 makes contact with the bearing 36 at a rolling contact point (CP) 40.

According to the present invention, the wobble distance is equal to the clearance in the bearing, which is the difference between the radii of the bearing 36 and the inner rotor radius. This clearance is specified in the fabrication process by the thickness of a sacrificial oxide; By insuring a bearing clearance smaller than the nominal air-gap size, the need for insulation between the rotor and the stator is eliminated.

As stated above, a significant problem with polysilicon, variable-capacitance side-drive micromotors is electrostatic clamping of the rotor. We have now discovered that the formation of a native oxide on these motors polysilicon surfaces appears to prevent the desired electrical contact between the rotor and its supports, resulting in the observed operational failures. The oxide both increases friction and causes clamping fields to develop. This necessitates use of air levitation assistance to overcome the frictional forces associated with the clamping of the rotor to the electric shield beneath it. This rotor clamping has been attributed to the existence of an electric field between the rotor and the shield, which field is caused by a lack of proper electrical contact between these respective parts. The electrical contact between the rotor and the shield during motor operation is intended to come from mechanical contact of the rotor with the shield or the bearing, all of which are heavily doped polysilicon components. It is noted that the bearing is fabricated in electrical contact with the shield.

According to the present invention, the center pin bearings contact an electrical shield under the rotor and extending under the stator poles. During motor operation, the rotor is intended to be in electrical contact with the shield positioned beneath it, through mechanical contact at the bearing or at bushing supports. The release and testing steps of the fabrication process minimizes native oxide formation.

Figure 1:
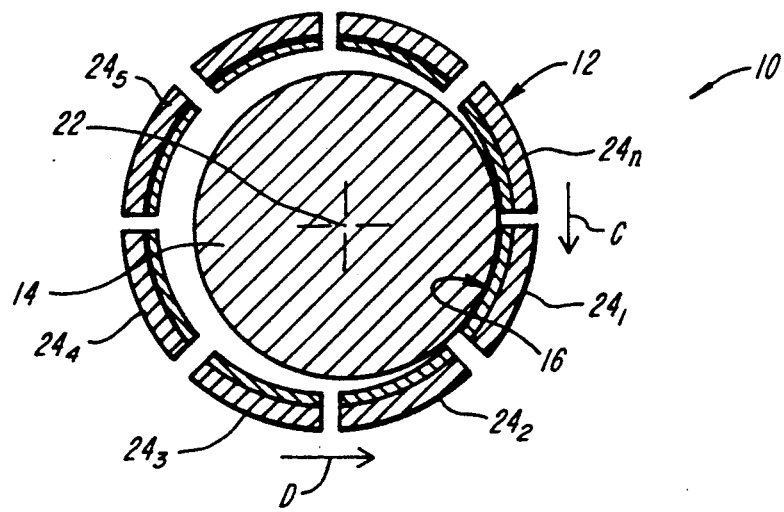
FIG. 1 is a diagrammatic illustration of a wobble type side drive motor according to the prior art.

Two significant differences may be observed between the design of the present invention and the prior art wobble motor design of FIG. 1. First, in the present invention, the excitation signal is applied in the direction indicated by arrow A, while the rotor rotates in the direction indicated by the arrow B, both of which are in the same direction By contrast, in the prior art, if the excitation is applied in the direction of arrow C, the rotor rotates in the direction indicated by arrow D, which are opposite directions Second, holding all other parameters constant (including stator radius), in the conventional wobble motor of FIG. 1, increasing the gear ratio increases the motor s output torque. However, the situation is more complicated in the motor of FIG. 2, in which the gear ratio is determined by the bearing clearance (a process parameter) and the bearing radius (a design parameter). The gear ratio is independent of the rotor outer radius but is inversely proportional to the bearing clearance (i.e., the difference between the rotor and bearing radius). At the same time, the motor s effective air-gap size (i e. nominal air gap minus the bearing clearance) is linearly proportional to the bearing clearance. However, the torque function is proportional to the reciprocal of the square of the effective air-gap size The net effect, therefore, of increasing the gear ratio by decreasing the bearing clearance is a decrease in the motor drive torque.

In the side-drive motors, the bearing clearance allows radial displacement of the rotor. When the rotor is electrically grounded and is symmetrically centered between a set of excited stator poles, the resultant of the radial forces on the rotor due to each excited stator pole is zero. However, when the rotor displaces radially, a net radial force develops, which pushes the rotor into the bearing post. Previous studies by others indicate that the bearing frictional forces at this contact may be significant. The radial movement may also lead to rotor vertical clamping forces by disturbing excitation symmetry. The smaller bearing clearances reduce rotor radial movement and the associated frictional forces in the bearing.

The wobble motor design concept illustrated in FIG. 2, using a small bearing clearance and eliminating the need for rotor-stator isolation, simplifies the fabrication process and also allows for the use of a single fabrication process for both wobble and other side drive motors. The motor fabrication process is similar to, but differs from, the processes previously documented in the literature. However, a center pin bearing contacting an electrostatic shield under the rotor and extending under the stator poles are used. This provides at least three improved features. First, the rotor-stator polysilicon is thick while the air-gaps are small, enhancing motor output torque. For example, the motor-stator polysilicon may be 2 $\mu$m thick with air gaps of about 1.5 $\mu$m anisotropically etched with RIE (i.e., reactive ion etching). Second, the bearing clearance is reduced to one third to one-half that previously recorded (i e., about 0.3 $\mu$m as opposed to 0.6–1.0 $\mu$m). Reducing the bearing clearance increases the resulting gear ratio. Third, no nitride solid lubrication is needed on the inner-rotor radius.

Figure 3A:
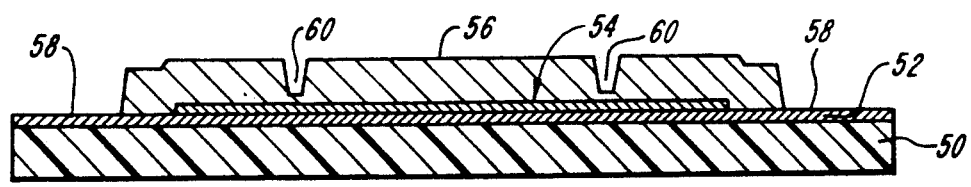
FIGS. 3A—3E are diagrammatic illustrations of a process for fabricating the micromotor of the present invention.
Figure 3B:
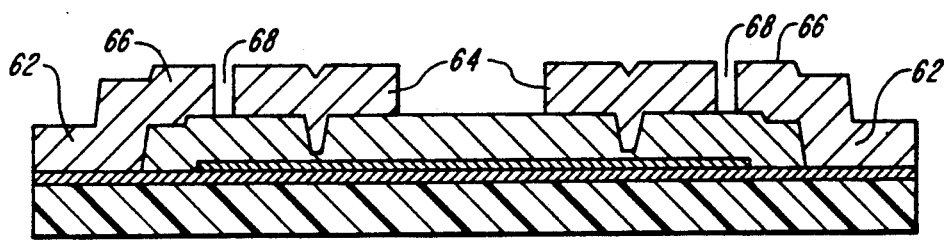
Figure 3C:
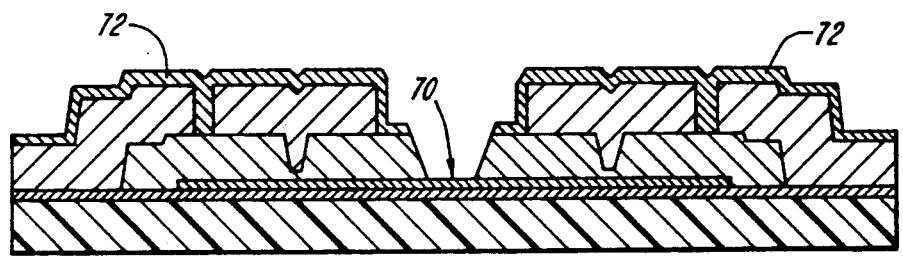

FIGS. 3A—3E show typical cross sections during the fabrication of the micromotor of the present invention Referring to FIG. 3A, a 1 $\mu$m thick $SiO_2$ film 50 is thermally grown for use as the substrate. Initial substrate isolation is established using a 1 $\mu$m thick LPCVD silicon-rich nitride layer 52 on the substrate. A thin (i.e., about 35/100 angstrom) LPCVD polysilicon film is deposited thereon, heavily doped with phosphorous, and patterned to form an electric shield 54. Next, a 2.2 $\mu$m thick low temperature oxide layer 56 is deposited. It is then patterned in two steps to form the stator anchors 58 and and the bushing molds 60. Turning to FIG. 3B, a 2.5 $\mu$m thick LPCVD polysilicon layer 62 is then deposited and heavily doped with phosphorous. The rotor 64, stator 66 and air gap 68 are patterned into this polysilicon layer using RIE techniques. The thickness of the polysilicon rotor stator layer 62 is 2.2 $\mu$m at this point, since a patterned thermally grown oxide mask is used for the RIE etching of the polysilicon. Observe that the inside radius of the rotor patterned at this point would correspond to the bearing radius of the final device. A bearing radius of 18 $\mu$m is the minimum conservative value for the process which has been employed. This value is determined by the pattern definition and delineation requirements for the bearing anchor 70 which is located inside a trench, as shown in FIG. 3C. A second sacrificial low temperature oxide layer 72 is deposited, providing an estimated 0.3 $\mu$m coverage on the rotor inside radius side-walls, and patterned to open the bearing anchor 70.

At this point, the non-uniformity of the resist thickness presents certain problems. Polyimide is thus used at this juncture as a planarizing material and soft mask. Two layers of polyimide are applied by spin coating, to a thickness of about 4.5 $\mu$m (total). A 1000 angstrom layer of aluminum is applied by vapor deposition. The aluminum is patterned with standard photolithographic techniques, using a 1.5 $\mu$m layer of photoresist. The aluminum pattern is then transferred into the polyimide in an $O_2$ plasma etch. Next, the remaining aluminum is removed.

Figure 3D:
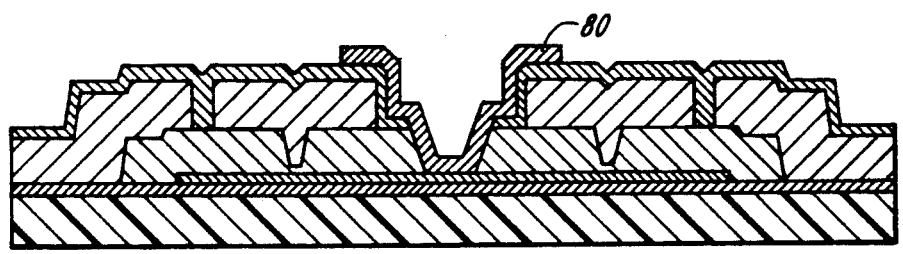

As shown in FIG. 3D, a 1 $\mu$m thick LPCVD polysilicon film is next deposited and heavily doped with phosphorous. The patterned polyimide is then employed as a mask to pattern the polysilicon in a reactive ion etch, to form the bearing 80. After it has been released in hydrofluoric acid (HF), the motor cross section is as appears in FIG. 3E. During motor operation, the bushings 82 are intended to provide the electrical contact between the rotor 64 and the shield 54, as they slide over the shield.

Figure 3E:
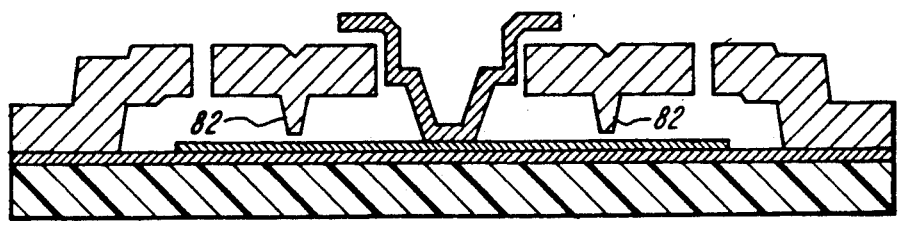

The substrate isolation provided by layer 52 prevents electrical contact between the rotor and the substrate, which otherwise would result in electric fields that could lead to the clamping of the rotor to the substrate. The positioning of an electric shield under the rotor was previously suggested for elimination of the rotor clamping forces by electrostatic shielding of the rotor from the substrate. However, we have found that even with electric shields, prior architecture required air levitation to overcome frictional forces associated with the clamping of the rotor. The native oxide on the motor polysilicon surfaces is believed to be the cause of the electrical contact failure giving rise to the clamping action. As seen in FIG. 3E, the rotor is intended during motor operation to be an electrical contact with the shield, through mechanical contacts in the bearing or at the bushing supports. The bearing is fabricated in electrical contact with the shield. This electrical contact ensures that the rotor and the shield are at the same electric potential, thereby eliminating the clamping forces otherwise caused by the electric field between them. However, it appears that native oxide formation on the bushings, the bearing and the shield surfaces result in a loss of electrical contact, leading to an electric field between the rotor and the shield. This results in a clamping of the rotor to the shield. In the past, air levitation has been used to compensate for this clamping action. With proper release and testing techniques directed at minimizing the formation of this oxide, however, such motors can readily be operated without air levitation for extended periods of time.

One previously reported release method consisted of immersing the structure for 15 minutes in a 49% (by weight) commercially available hydrofluoric acid (HF) solution, rinsing 5 minutes in deionized water (DI), rinsing briefly in methanol, and then drying in a nitrogen atmosphere. Typically, 30 minutes elapsed before testing, during which the devices were in an ambient room atmosphere. This combination of releasing and testing did not provide working motors without air levitation. By contrast, the now preferred release method consists of immersing the structure for 15 minutes in a 49% (by weight) commercially-available HF solution, rinsing for two minutes in a DI rinse, immersing for 5 minutes in a 1:1 $H_2SO_4:H_2O_2$ (pirana) clean bath, rinsing 10 minutes in DI, then rinsing 30 seconds in the HF solution, 90 seconds in DI, and drying in a nitrogen atmosphere. The initial 15 minute oxide etch in the HF solution is required to release the various motors on the dye. The 5 minute pirana clean soak is effective in cleaning the exposed polysilicon surfaces from organic as well as ionic contaminants. The second HF etch step removes the thin oxide formed on the polysilicon surfaces during the pirana clean operation. The final DI rinse time appears to be critical. Rinse times under 60 seconds do not produce reliable results. At the same time, though, long rinse times may be detrimental, since the native oxide growth rate is greater in deionized water than in air. A 90 second rinse time has been typically used with good results.

Successful electrical operation of these motors in room atmosphere is achieved, without air levitation, when freshly released motors are tested as quickly as possible. Using the above-described release process and testing procedure, motor operation durations have been as high as 120 minutes for the wobble motors of the type shown in FIG. 2. The initial failure is gradual and motor operation can be resumed temporarily if the field voltage is increased to provide higher drive torque. After total failure, motor operation can be restored is the motor is re-released and tested promptly. Alternatively, air levitation can be used to resume motor operation after total failure. When the motors have not been exposed to air after release and are tested in a nitrogen atmosphere, the rotor clamping failure mechanism is eliminated. In this case, such wobble motors (and side-drive motors) operate consistently for at least several hours.

Aspects of the foregoing fabrication technique may be applied, also, to improve the fabrication of conventional wobble motors of the type shown in FIG. 1. For example, after the steps analogous to those of FIGS. 3A and 3B, an LPCVD nitride deposition may be performed, followed by an RIE etch back, to create a nitride spacer on the side walls of the rotor and/or stator.

Having thus described the basic concept of the invention, it will be readily apparent to those skilled in the art that the foregoing detailed disclosure is intended to be presented by way of example only, and is not limiting. Various alterations, improvements, and modifications will occur and are intended to those skilled in the art, though not expressly stated herein. These modifications, alterations, and improvements are intended to be suggested to be suggested hereby, and are within the spirit and scope of the invention. Accordingly, the invention is limited only by the following claims and equivalents thereto:

What is claimed is:

1. A microfabricated harmonic side-drive motor comprising:
    a. a plurality of electrostatically driven stator poles each having an arcuate surface portion arrayed in a circular arrangement;
    b. a rotor having an axis and a substantially circular cross-section and disposed within a circular stator and
    c. means for allowing the rotor to move such that its axis rotates around a central axis of the stator when excitation is applied to the stator, while maintaining a gap between the rotor and the stator without need for an insulating layer between the rotor and stator.

2. The motor of claim 1 wherein the rotor has concentric outer and inner surfaces and the means for allowing the rotor to move comprises a center-pin bearing disposed substantially along the stator axis and coacting with the inner surface of the rotor to prevent the outer surface of the rotor from moving closer to the inner surface of the stator then a preselected distance, which is maintained as the rotor rotates and revolves around the bearing.

3. The motor of claim 2, further comprising:
    a. a substrate for supporting said stator, said rotor and said center-pin bearing; and
    b. an electric shield disposed between said substrate and said rotor, and in electrical contact with said center-pin bearing.

4. The motor of claim 3, wherein the rotor further comprises:
    at least one bushing member protruding from the stator for providing sliding electrical contact with said electric shield.

5. The motor of claim 3, wherein said electric shield comprises:
    a layer of phosphorus-doped polysilicon.

* * * * *

UNITED STATES PATENT AND TRADEMARK OFFICE
CERTIFICATE OF CORRECTION

PATENT NO. : 5,093,594

DATED : March 3, 1992

INVENTOR(S) : Mehran Mehregany

It is certified that error appears in the above-identified patent and that said Letters Patent is hereby corrected as shown below:

COLUMN 1. LINE 13

--This invention was made with government support under Contract No. ECS-8614328 awarded by the National Science Foundation. The government has certain rights in the invention.--

Signed and Sealed this

Fourteenth Day of September, 1993

Attest:

BRUCE LEHMAN

*Attesting Officer*   *Commissioner of Patents and Trademarks*